(12) United States Patent
Park

(10) Patent No.: US 12,063,764 B2
(45) Date of Patent: Aug. 13, 2024

(54) HEAT DISSIPATION LAYER AND DISPLAY DEVICE INCLUDING THE SAME

(71) Applicant: Samsung Display Co., LTD., Yongin-si (KR)

(72) Inventor: Jae Chun Park, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 346 days.

(21) Appl. No.: 17/544,105

(22) Filed: Dec. 7, 2021

(65) Prior Publication Data

US 2022/0201904 A1 Jun. 23, 2022

(30) Foreign Application Priority Data

Dec. 18, 2020 (KR) .................... 10-2020-0178321

(51) Int. Cl.
  *H05K 7/00* (2006.01)
  *H05K 1/14* (2006.01)
  *H05K 7/20* (2006.01)
(52) U.S. Cl.
  CPC ......... *H05K 7/20954* (2013.01); *H05K 1/147* (2013.01); *H05K 2201/10128* (2013.01)

(58) Field of Classification Search
  CPC ............... H05K 7/20954; H05K 1/147; H05K 2201/10128
  USPC ..................................................... 361/679.01
  See application file for complete search history.

(56) References Cited

U.S. PATENT DOCUMENTS

2019/0173052 A1* 6/2019 Oh ........................ H10K 59/12
2020/0310577 A1* 10/2020 Jeon .................... H10K 50/844
2021/0050534 A1* 2/2021 Yang .................... H10K 71/00

FOREIGN PATENT DOCUMENTS

KR   1020180118332 A   10/2018
KR   1020200048205 A   5/2020

* cited by examiner

*Primary Examiner* — Binh B Tran
(74) *Attorney, Agent, or Firm* — CANTOR COLBURN LLP

(57) ABSTRACT

A display device includes a display module including a display area and a non-display area which is adjacent to the display area, a printed circuit film attached to the display module at the non-display area thereof, and a first heat dissipation layer corresponding to the non-display area of the display module. The first heat dissipation layer extends from the non-display area of the display module to correspond to the printed circuit film.

20 Claims, 14 Drawing Sheets

HEAT DISSIPATION LAYER AND DISPLAY DEVICE INCLUDING THE SAME

This application claims priority to Korean Patent Application No. 10-2020-0178321 filed on Dec. 18, 2020, and all the benefits accruing therefrom under 35 U.S.C. § 119, the disclosure of which is incorporated herein by reference in its entirety.

BACKGROUND

1. Field

The invention relates to a display device.

2. Description of the Related Art

Electronic devices such as a smartphone, a tablet personal computer ("PC"), a digital camera, a laptop computer, a navigation device, and a smart television that provide an image include display devices for displaying the image. The display device includes a display module that generates and displays an image, and various input devices.

The input device of the display device may include a printed circuit film attached to an end portion of the display module to apply a data voltage and/or a scan signal to the display module.

Heat dissipation tapes may be disposed on a lower surface of the display module and a lower surface of the printed circuit film to dissipate heat generated from the display module and the input device, to the outside.

SUMMARY

One or more embodiment provides a display device with an improved heat dissipation function for dissipating heat generated from a display module and/or a printed circuit film.

Features of the invention are not limited to those mentioned above, and other features not mentioned above will be clearly understood by those skilled in the art from the following description.

According to an embodiment, a display device includes a display module including a main area, and a protruding area protruding from the main area in one direction and having a width smaller than a width of the main area, a printed circuit film attached to the protruding area of the display module, and a heat dissipation tape disposed to overlap the display module and the printed circuit film and integrally formed therewith.

According to an embodiment, a display device includes a display module including a main area, and a protruding area protruding from the main area in one direction, having a width smaller than a width of the main area, and including a sub area and a bending area positioned between the main area and the sub area, a printed circuit film attached to the protruding area of the display module, and a heat dissipation tape disposed to overlap the sub area of the display module and the printed circuit film and integrally formed therewith. The display module is bent in a thickness direction in the bending area, the sub area overlaps the main area in the thickness direction, the heat dissipation tape is disposed between the main area of the display module and the sub area of the display module, the heat dissipation tape overlaps the printed circuit film in the thickness direction, the printed circuit film includes a main film portion having a first width, an attachment film portion having a second width and attached to the sub area of the display module, and a connection film portion having a third width and spaced apart from the attachment film portion with the main film portion therebetween, the first width is larger than the second width, and the second width is larger than the third width, and the heat dissipation tape has a variable thickness from the sub area to the printed circuit film.

Specific details of embodiments are included in the detailed description and drawings.

BRIEF DESCRIPTION OF THE DRAWINGS

The above and other features of the invention will become more apparent by describing in detail embodiments thereof with reference to the attached drawings, in which.

DETAILED DESCRIPTION

Figure 1:
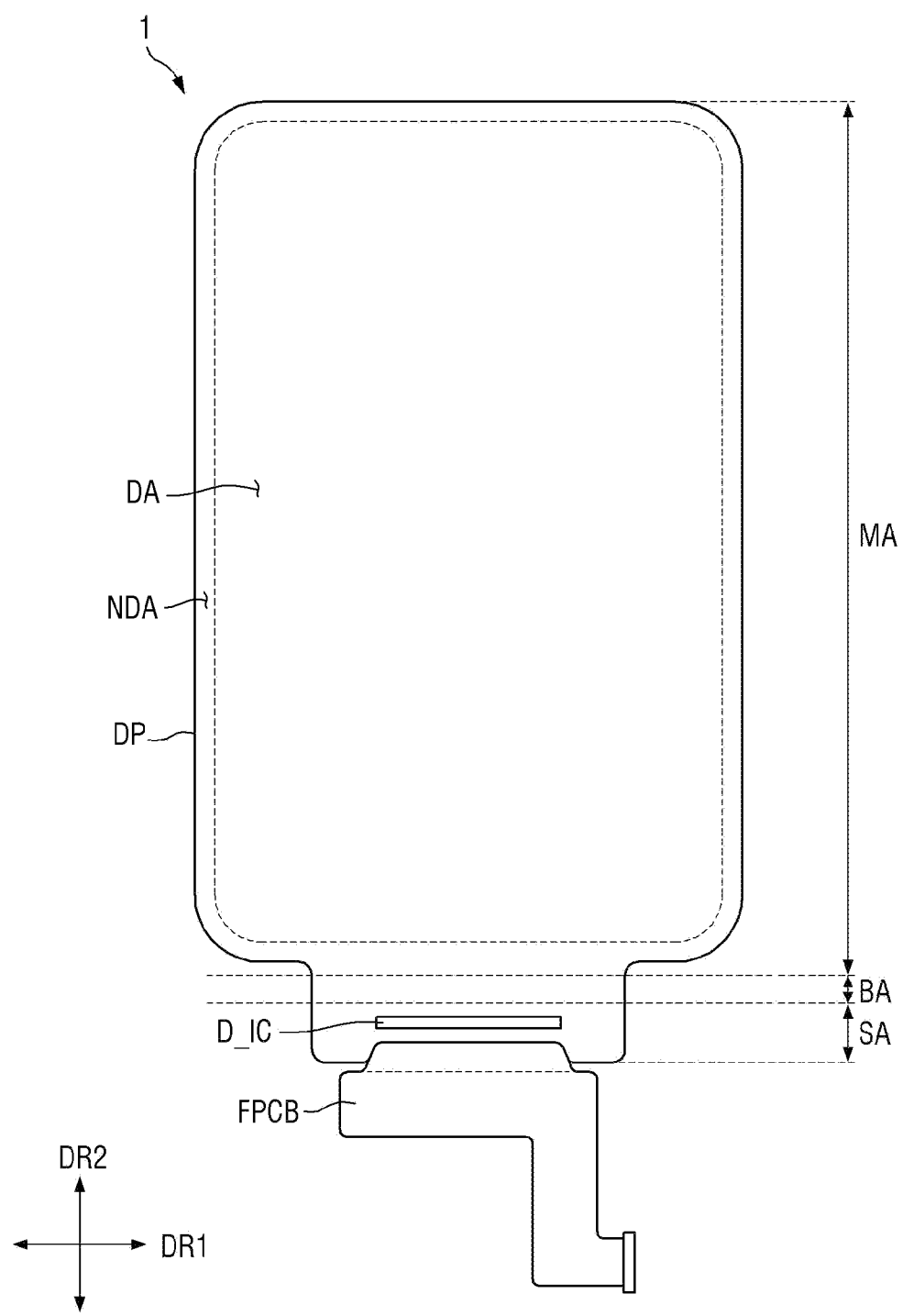
FIG. 1 is a plan view of an embodiment of a display device.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled"

or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

FIG. 1 is a plan view of an embodiment of a display device 1.

In exemplary embodiments, a first direction DR1 and a second direction DR2 cross each other. In the plan view of FIG. 1, for convenience of explanation, the first direction DR1 that is a horizontal direction and the second direction DR2 that is a vertical direction are defined. In the following embodiments, one side of the first direction DR1 refers to a right direction in a plan view, the opposite side to the first direction DR1 refers to a left direction in a plan view, and one side of the second direction DR2 refers to a top direction in a plan view, and the opposite side to the second direction DR2 refers to a down direction in a plan view, respectively. However, the directions mentioned in the embodiments should be understood as referring to the relative directions, and the embodiments are not limited to the mentioned directions. A thickness direction of the display device 1 and various layers thereof is defined along a third direction DR3 which crosses each of the first direction DR1 and the second direction DR2.

Referring to FIG. 1, a display device 1 may refer to any electronic device that provides a display screen at which an image is displayed. In embodiment, for example, the display device 1 may include a television, a laptop computer, a monitor, a billboard, an Internet of Things device, and the like as well as portable electronic devices such as a mobile phone, a smart phone, a tablet PC (personal computer), a smart watch, a watch phone, a mobile communication terminal, an electronic organizer an e-book reader, a portable multimedia player (PMP), a navigation device, a game console, a digital camera, and the like that provide display screens.

The display device 1 may include a display area DA and a non-display area NDA. The display area DA may display an image and the non-display area NDA may not display the image. The display area DA may include a plurality of pixels. A shape of the display area DA may be a rectangle or a rectangle with rounded corners. Referring to FIG. 1, a shape of the display area DA may be a rectangle with a rounded corner and having sides extended along the second direction DR2 which are longer than sides extended along the first direction DR1. However, the invention is not limited thereto, and the display area DA may have various shapes such as a rectangular shape in which sides extended along the first direction DR1 are longer than sides extended along the second direction DR2, a square shape, other polygonal shapes, a circular shape, and an elliptical shape.

The non-display area NDA may be disposed adjacent to the display area DA. In an embodiment, the non-display area NDA may be around the display area DA in a plan view. The non-display area NDA may be a bezel area. The non-display area NDA may surround all sides (four sides in the drawing) of the display area DA. However, the invention is not limited thereto, and for example, the non-display area NDA may not be disposed near the upper side or near the left and right sides of the display area DA.

Signal lines or driving integrated circuits for applying a signal (e.g., electrical signal such as a control signal, driving signal, etc.) to the display area DA may be disposed in the non-display area NDA.

The display device 1 includes a display module DP that provides a display screen of the display device 1. The display module DP may include a display panel. As an example of the display panel, an organic light-emitting display panel, a micro-LED display panel (e.g., micro light emitting diode display panel), a nano LED display panel, a quantum dot light-emitting display panel, a liquid crystal display panel, a plasma display panel, a field emission display panel, an electrophoretic display panel, and an electrowetting display panel may be mentioned. Hereinafter, a case in which the organic light-emitting display panel is applied as an example of the display module DP is exemplified, but the invention is not limited thereto, and when the same technical spirit is applicable, other display panels may also be applied.

The display module DP may include a plurality of pixels at which light is generated, light is emitted, an image is displayed, etc. The plurality of pixels may be arranged in a matrix form within the display area DA. A shape of each pixel may be rectangular or square on a plane (e.g., in a plan view such as along the third direction DR3), but the invention is not limited thereto, and may also be a rhombic shape in which each side is inclined with respect to the first direction DR1. Each pixel may include a light-emitting area. Each light-emitting area may have the same shape as the pixel, but may have different shapes from the pixel. In an embodiment, for example, when the shape of the pixel is a rectangle, the shape of the light emitting area of the corresponding pixel may have various shapes such as a rectangle, a rhombus, a hexagon, an octagon, and a circle.

The display module DP may include a flexible substrate containing a flexible polymeric material such as polyimide. Accordingly, the display module DP is bendable foldable, or rollable.

The display module DP may include a bending area BA at which the display module DP is bendable. The display module DP may be divided into a main area MA positioned on one side (e.g., a first side) of the bending area BA and a sub area SA positioned on the other side (e.g., a second side opposite to the first side) of the bending area BA with the bending area BA therebetween. The main area MA, the bending area BA and the sub area SA may be in order along the second direction DR2.

The display area DA of the display module DP may be disposed in the main area MA. In an embodiment, a peripheral edge portion of the display area DA in the main area MA, an entirety of the bending area BA, and an entirety of the sub area SA may become non-display areas. However, the invention is not limited thereto, and the bending area BA and/or the sub area SA may also include a portion of the display area DA.

The main area MA may generally have a shape similar to a planar outer shape of the display device 1. The main area MA may be a flat area positioned on one plane. However, the invention is not limited thereto, and at least one edge of remaining edges other than an edge (side) connected to the bending area BA in the main area MA may be curved to form a curved surface or may be bent along a vertical direction.

When at least one of the remaining edges other than the edge (side) connected to the bending area BA in the main area MA is curved or bent, the display area DA may also be disposed at the corresponding edge. However, the invention is not limited thereto, and the curved edge or the bent edge may become a portion of the non-display area NDA that does not display an image, or the display area DA and the non-display area NDA may be mixed in the corresponding area.

The bending area BA may be connected to the other side of the main area MA in the second direction DR2. In an embodiment, for example, the bending area BA may be connected through a lower short side of the main area MA. Each of the main area MA, the bending area BA and the sub area SA may have a width along the first direction DR1. A width of the bending area BA may be smaller than a width (a width of the short side) of the main area MA. A connection portion between the main area MA and the bending area BA may have an L-shape.

A downward direction may be opposite to the third direction DR3 while a display screen or display surface may be in the third direction DR3. In the bending area BA, the display module DP may be bendable with a curvature extended downward along a thickness direction, that is, in a direction opposite to a display surface. The bending area BA may have a constant radius of curvature, but the invention is not limited thereto, and may have a different radius of curvature for various sections. As the display module DP is bendable in the bending area BA, a surface of the display module DP may be reversed. That is, an upper surface of the display module DP facing upward (e.g., in the third direction DR3) may be changed so as to face outward through the bending area BA and then faces downward again.

The sub area SA extends from the bending area BA. The display module DP which is bent dispose the sub area SA parallel to the main area MA. The display module DP which bent dispose the sub area SA overlapping the main area MA along the thickness direction of the display module DP. A width of the sub area SA (a width in the first direction DR1) may be the same as the width of the bending area BA, but the invention is not limited thereto.

The bending area BA and the sub area SA may form a protruding area protruding from the other side of the main area MA along the second direction DR2. A width of the protruding area may be substantially the same as the width of the bending area BA. Accordingly, the width of the protruding area may be smaller than the width of the main area MA.

A driving integrated circuit D_IC may be disposed in the sub area SA. The driving integrated circuit D_IC may be provided as a driving chip, but the invention is not limited thereto.

A printed circuit film FPCB may be attached to the display module DP at the sub area SA thereof. The printed circuit film FPCB may provide an electrical signal such as a data voltage and/or a scan signal to the plurality of pixels of the display module DP.

Figure 2:
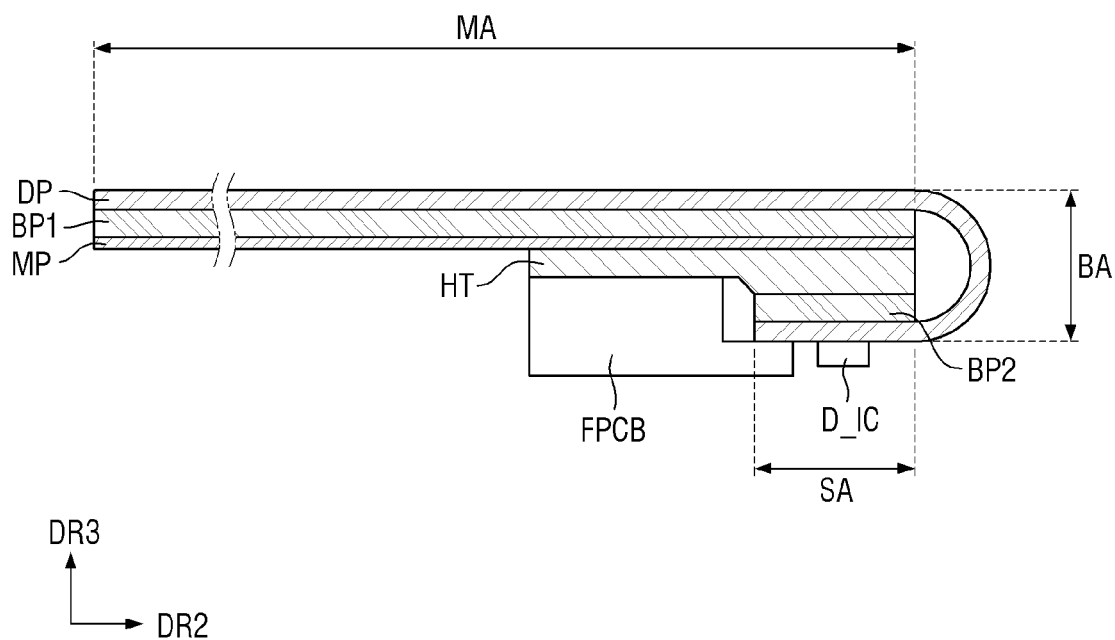
FIG. 2 is a schematic cross-sectional view of the display device.

FIG. 2 is a schematic cross-sectional view of an embodiment of a display device 1. FIG. 2 is a cross-sectional view taken along the second direction DR2 of the display device of FIG. 1.

Hereinafter, as shown in FIG. 2, one surface of the main area MA will be referred to as an upper surface of the main area MA, the other surface of the main area MA will be referred to as a lower surface of the main area MA, one surface of the sub area SA will be referred to as a lower surface of the sub area SA, and the other surface of the sub area SA will be referred to as an upper surface of the sub area SA. Referring to FIG. 2, the display module DP which is bent at the bending area BA disposes the main area MA and the sub area SA overlapping along the thickness direction. That is, the other surface of the main area MA and the other surface of the sub area SA may face each other.

The display device 1 (see 1 of FIG. 1) may further include a first backplane BP1 disposed on the lower surface of the main area MA of the display module DP and a second backplane BP2 disposed on the upper surface of the sub area SA of the display module DP. The first backplane BP1 and the second backplane BP2 may together form a backplane layer. The backplane layer may correspond to the main area MA and the sub area SA of the display module DP. The backplane layer may be disconnected at the bending area BA of the display module DP.

The backplanes BP1 and BP2 may reduce or effectively prevent areas of the display module DP from being bent due to an external force, or may reduce a degree of bending. The backplanes BP1 and BP2 may maintain the areas of the display module DP in a relatively flat state even when the external force is applied.

The backplanes BP1 and BP2 may include a material having rigid or semi-rigid properties. Specifically, the backplanes BP1 and BP2 may contain a metal material such as stainless steel ("SUS"), aluminum, or the like, or a polymer material such as polymethyl methacrylate ("PMMA"), polycarbonate ("PC"), polyvinylalcohol ("PVA"), acrylonitirle-butadiene-styrene ("ABS"), polyethylene terephthalate ("PET"), or the like. In an embodiment, for example, the backplanes BP1 and BP2 may be stainless steel films having a thickness of about 150 micrometers ($\mu$m) to about 200 $\mu$m. In an embodiment, the backplanes BP1 and BP2 may be aluminum films having a thickness of about 150 $\mu$m to about 200 $\mu$m.

The display device 1 may further include a heat dissipation layer MP (e.g., first heat dissipation layer) disposed on a lower surface of the first backplane BP1 which is furthest from the display module DP. In an embodiment, the first backplane BP1 may be considered as including the heat dissipation layer MP. The heat dissipation layer MP may be disposed to overlap (or correspond to) the main area MA of the display module DP. The heat dissipation layer MP serves to diffuse heat generated from the display module DP or other components of the display device 1. The heat dissipation layer MP may include a metal plate. The metal plate may include, for example, a metal having excellent thermal conductivity, such as copper or silver. In embodiments, the heat dissipation layer MP may also be a heat dissipation sheet containing graphite, carbon nanotubes, or the like.

Although not shown in the drawing, the display device 1 may include at least one functional layer disposed on the lower surface of the first backplane BP1 in addition to the heat dissipation layer MP. The functional layer may be a layer that performs a function of the display device 1 such as an electromagnetic wave shielding function, a grounding function, a buffering function, a strength reinforcing function, a supporting function and/or a digitizing function. The functional layer may be a sheet layer made of a sheet, a film layer made of a film, a thin film layer, a coating layer, a panel, a plate, or the like. One functional layer may be formed (or provided) of a single layer, but may also be formed of a plurality of stacked thin films or coating layers. In FIG. 2, it is exemplified that the heat dissipation layer MP is disposed directly under the first backplane BP1, but the display device 1 including the exemplified functional layer disposes the functional layer between the heat dissipation layer MP and the first backplane BP1. The display device 1 including two or more of the exemplified functional layers disposes any one of the functional layers between the heat dissipation layer MP and the first backplane BP1, and the other functional layer under the heat dissipation layer MP (e.g., further from the display module DP than the one functional layer).

The display device 1 may further include a heat dissipation tape HT (e.g., second heat dissipation layer) disposed to overlap the display module DP and the printed circuit film FPCB. The display module DP which is bent disposes the heat dissipation tape HT between the main area MA of the display module DP and the sub area SA of the display module DP. The heat dissipation tape HT may overlap the printed circuit film FPCB along the thickness direction.

The heat dissipation tape HT may couple the heat dissipation layer MP and the printed circuit film FPCB that overlap each other, and the heat dissipation layer MP and the second backplane BP2 that overlap each other, to each other. The heat dissipation tape HT may be in direct contact with the heat dissipation layer MP and the printed circuit film FPCB that overlap each other, and the heat dissipation layer MP and the second backplane BP2 that overlap each other. As described above, when the display device 1 includes functional layers other than the heat dissipation layer MP, the heat dissipation tape HT may be in direct contact with the heat dissipation layer MP and the lowermost member among the other functional layers.

The heat dissipation tape HT may have a variable thickness in a direction from the sub area SA to the printed circuit film FPCB. The heat dissipation tape HT may include a metal layer and adhesive layers sandwiching the metal layer therebetween. The heat dissipation tape HT may be integrally formed to define a single body. A detailed description of this will be described later.

Figure 3:
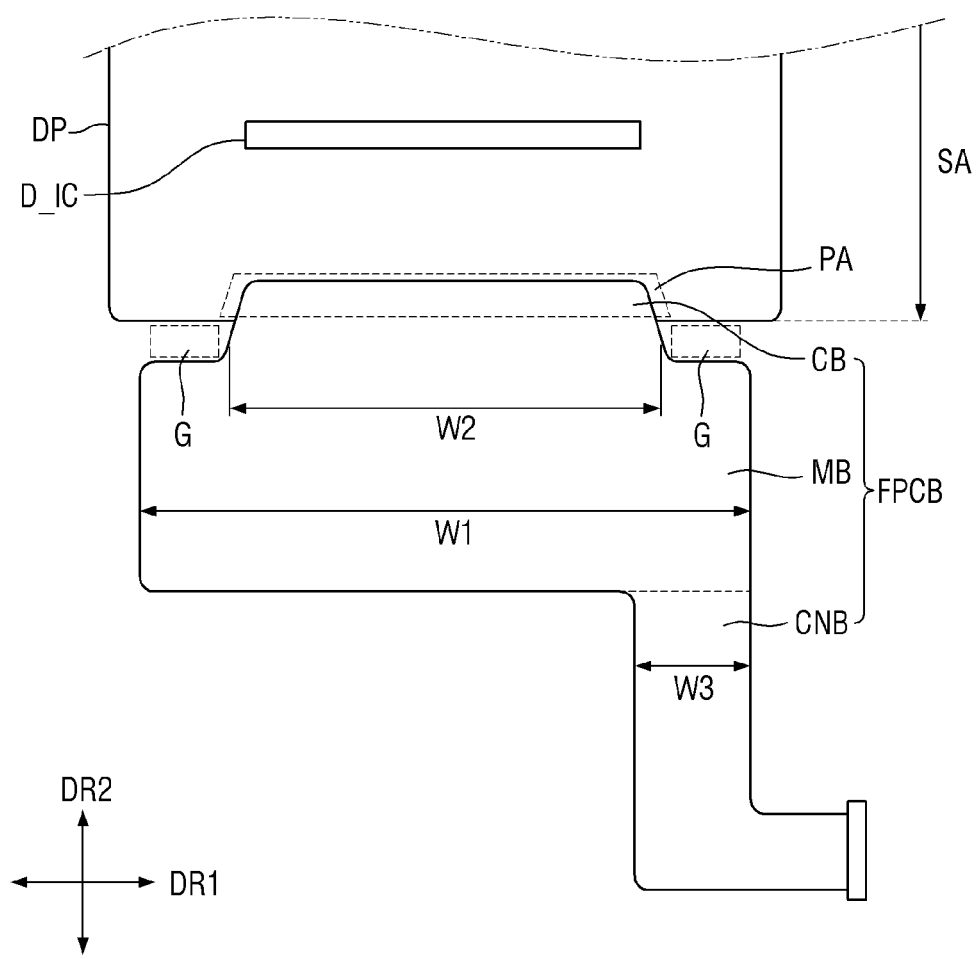
FIG. 3 is a plan view showing an embodiment of a sub area of a display module and a printed circuit film attached to the sub area.
Figure 4:
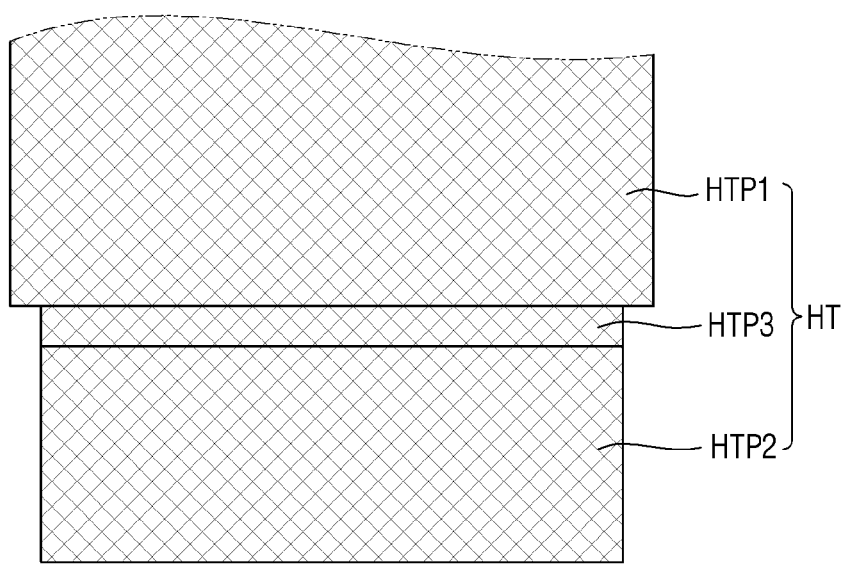
FIG. 4 is a plan view showing an embodiment of a heat dissipation tape.
Figure 4:
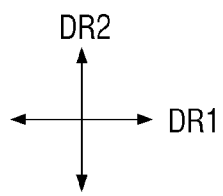
Figure 5:
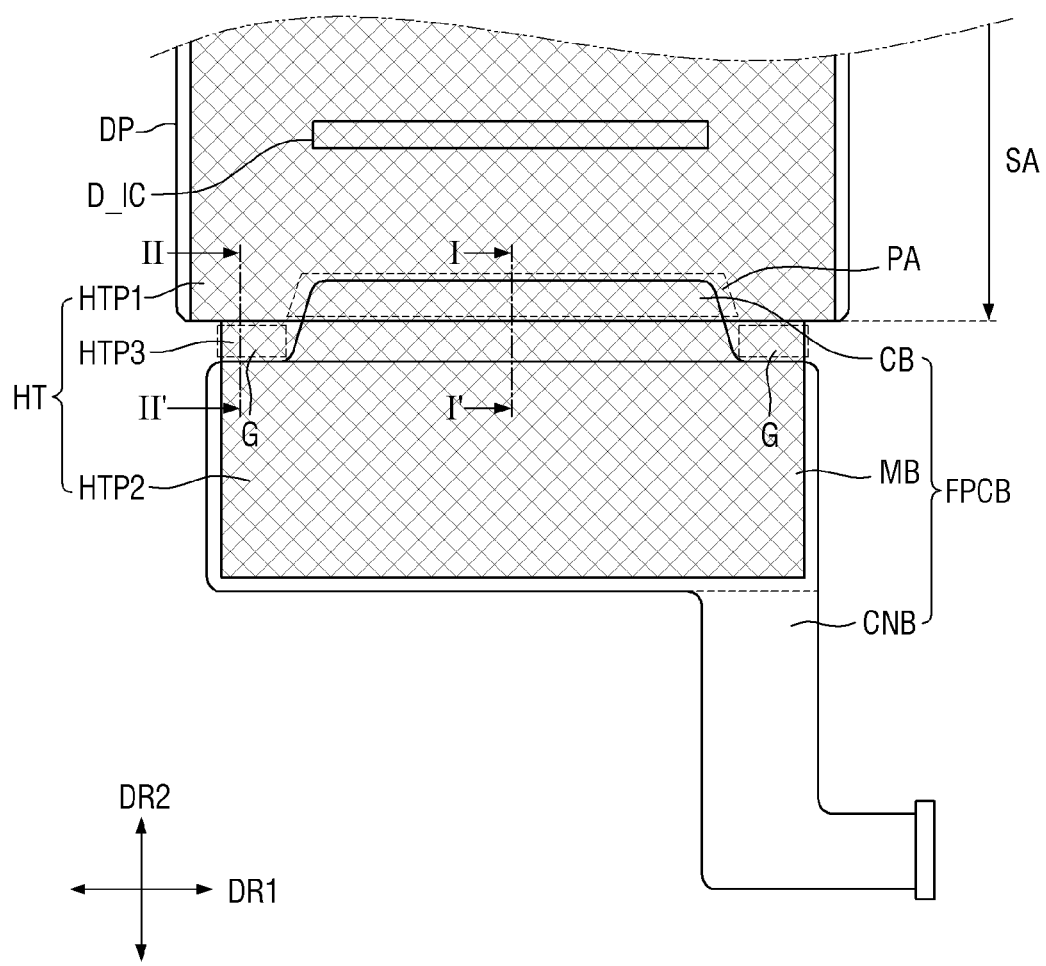
FIG. 5 is a plan view showing an embodiment of attachment of the heat dissipation tape in FIG. 4 to the sub area of the display module and the printed circuit film in FIG. 3.

FIG. 3 is an enlarged plan view showing an embodiment of a sub area SA of a display module DP and a printed circuit film FPCB which is attached to the sub area SA. FIG. 4 is a plan view showing an embodiment of a heat dissipation tape HT. FIG. 5 is a plan view showing an embodiment of attachment of the heat dissipation tape HT in FIG. 4 to the sub area SA of the display module DP and the printed circuit film FPCB in FIG. 3.

Referring to FIGS. 3 to 5, the sub area SA of the display module DP may include a pad area PA which receives an electrical signal from outside the display module DP. The printed circuit film FPCB may be attached to the display module DP at the pad area PA thereof.

The printed circuit film FPCB may include a main film portion MB (e.g., main portion) having a first width W1, an attachment film portion CB (e.g., attachment portion) having a second width W2 and attached to the sub area SA of the display module DP, and a connection film portion CNB (e.g., connection portion) having a third width W3 and spaced apart from the attachment film portion CB with the main film portion MB therebetween. The widths of the printed circuit film FPCB which are described above may be a maximum dimension along the first direction DR1, without being limited thereto.

The attachment film portion CB may be physically connected to a central portion of the main film portion MB, and may protrude from the central portion of the main film portion MB toward the sub area SA of the display module DP. An outer portion of the main film portion MB may be disposed at opposing sides of the attachment film portion CB. The outer portion of the main film portion MB which extends further than the opposing sides of the attachment film portion CB along the first direction DR1 may be spaced apart from the sub area SA of the display module DP with a gap G therebetween. The first width W1 may be greater than the second width W2, and the second width W2 may be greater than the third width W3.

The heat dissipation tape HT may include a first heat dissipation tape portion HTP1 (e.g., first heat dissipation portion) overlapping (or corresponding to) the sub area SA of the display module DP, a second heat dissipation tape portion HTP2 (e.g., second heat dissipation portion) overlapping the main film portion MB, and a third heat dissipation tape portion HTP3 (e.g., third heat dissipation portion) disposed between the first heat dissipation tape portion HTP1 and the second heat dissipation tape portion HTP2. The third heat dissipation tape portion HTP3 connects the first heat dissipation tape portion HTP1 and the second heat dissipation tape portion HTP2 to each other.

Planar shapes of the first and second heat dissipation tape portions HTP1 and HTP2 may be substantially rectangular shapes. The planar shape of the first heat dissipation tape portion HTP1 may be substantially the same as a planar shape of the sub area SA of the display module DP, and a planar size of the first heat dissipation tape portion HTP1 may be substantially the same as a planar size of the sub area SA of the display module DP. The planar shape of the second heat dissipation tape portion HTP2 may be substantially the same as a planar shape of the main film portion MB of the printed circuit film FPCB, and a planar size of the second heat dissipation tape portion HTP2 may be substantially the same as a planar size of the main film portion MB of the printed circuit film FPCB.

The third heat dissipation tape portion HTP3 may extend along the first direction DR1. A major dimension of the third heat dissipation tape portion HTP3 may extend along the first direction DR1. Along the first direction DR1, ends of the second heat dissipation tape portion HTP2 and ends of the third heat dissipation tape portion HTP3 may be aligned with each other along the second direction DR2, without being limited thereto. The third heat dissipation tape portion HTP3 extends further than the opposing sides of the attachment film portion CB along the first direction DR1 to correspond to the gap G.

The heat dissipation tape HT may include a metal layer, a lower adhesive layer disposed between the metal layer and the sub area SA of the display module DP and between the metal layer and the printed circuit film FPCB, and an upper adhesive layer disposed between the metal layer and the main area MA of the display module DP. The heat dissipation tape HT may have a structure in which the metal layer is sandwiched between the lower adhesive layer and the upper adhesive layer.

Figure 6:
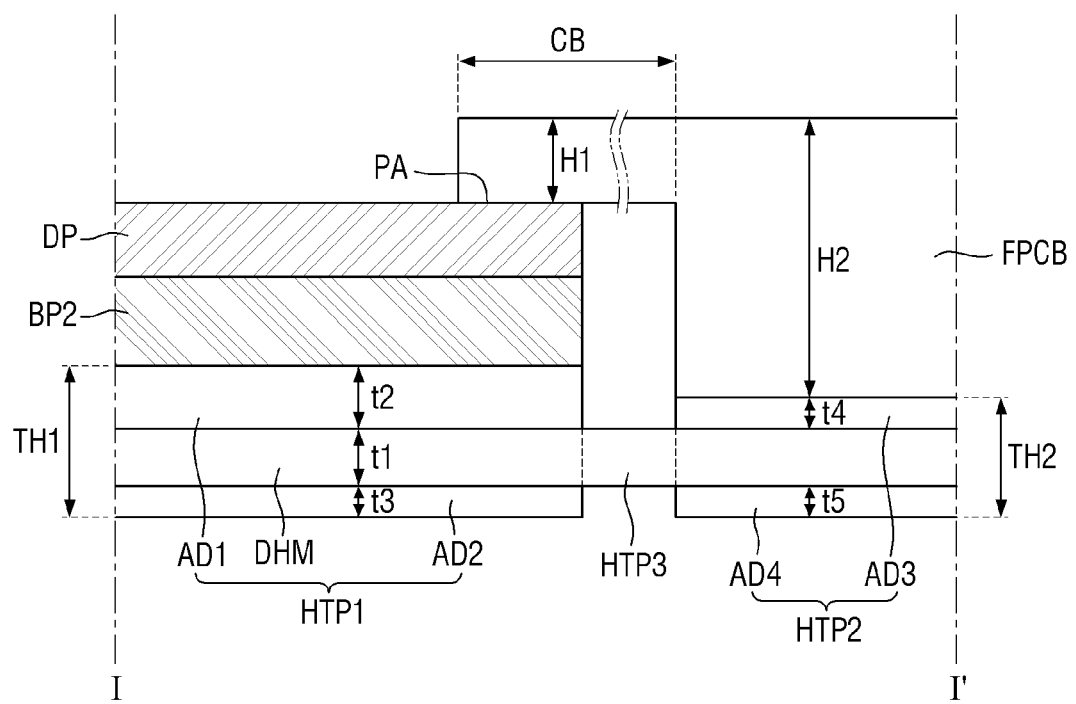
FIG. 6 is an enlarged cross-sectional view taken along line I-I' of FIG. 5.
Figure 7:
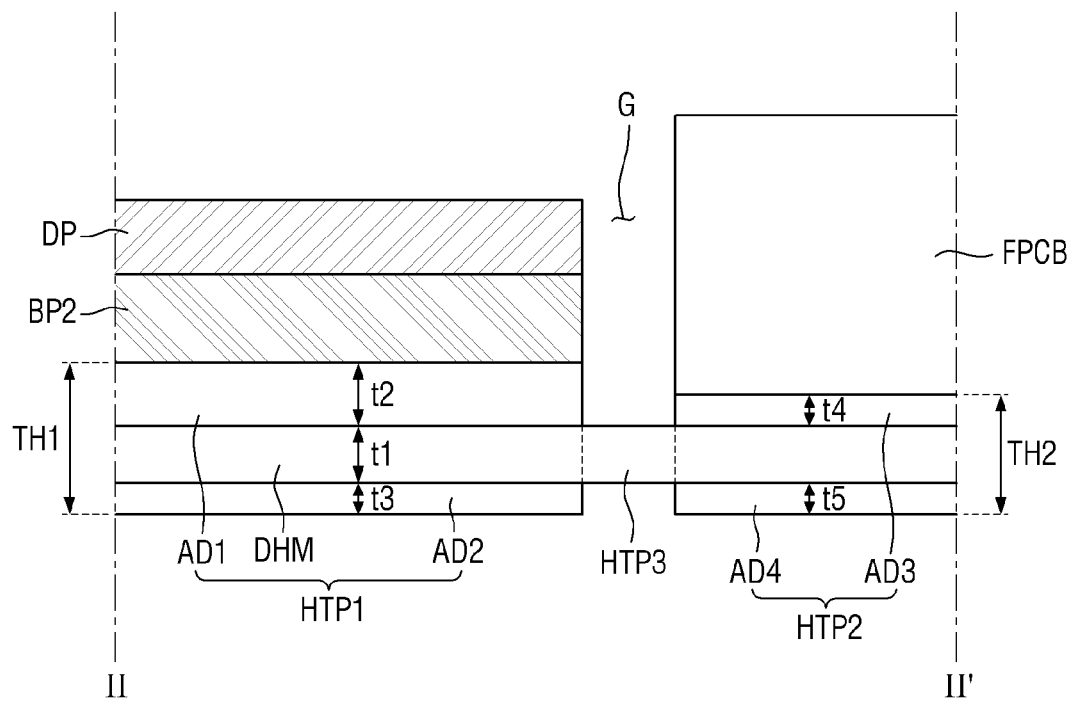
FIG. 7 is an enlarged cross-sectional view taken along line II-II' of FIG. 5.

FIG. 6 is an enlarged cross-sectional view taken along line I-I' of FIG. 5. FIG. 7 is an enlarged cross-sectional view taken along line II-II' of FIG. 5. The cross-sectional views according to FIGS. 6 and 7 may be the cross-sectional view of FIG. 2 inverted vertically. Accordingly, the upper (on) and lower (under) referred to in FIG. 2 refer to the lower (under) and the upper (on) in FIGS. 6 and 7, respectively.

Referring to FIGS. 6 and 7, as described above, the heat dissipation tape HT may have a variable thickness from the sub area SA to the printed circuit film FPCB along the second direction DR2. A first total thickness TH1 of the heat dissipation tape HT overlapping the sub area SA of the display module DP may be greater than a second total thickness TH2 of the heat dissipation tape HT overlapping the main film portion MB of the printed circuit film FPCB, and a thickness of the heat dissipation tape HT at the third heat dissipation tape portion HTP3 overlapping an area between an end portion of the display module DP and the main film portion MB of the printed circuit film FPCB may be smaller than the second total thickness TH2 of the heat dissipation tape HT overlapping the main film portion MB of the printed circuit film FPCB. The first total thickness TH1 and the second total thickness TH2 may be a total thickness of the heat dissipation tape HT at respective planar areas thereof.

The lower adhesive layer and the upper adhesive layer may not be disposed in a portion overlapping the area between the end portion of the sub area SA of the display module DP and the main film portion MB of the printed circuit film FPCB on a plane (e.g., at the third heat dissipation tape portion HTP3 of the heat dissipation tape HT).

In FIGS. 6 and 7, it is shown that the lower adhesive layer and the upper adhesive layer are not disposed in the portion overlapping the area between the end portion of the sub area SA of the display module DP and the main film portion MB of the printed circuit film FPCB on a plan, but the invention is not limited thereto, and only the upper adhesive layer may be disposed and only the lower adhesive layer may not be disposed (e.g., may be excluded), or only the lower adhesive layer may be disposed and only the upper adhesive layer may not be disposed. Alternatively, the metal layer may be integrally disposed from the sub area SA to the printed circuit film FPCB. That is, the metal layer may be common layer to each of the sub area SA and the printed circuit film FPCB.

The first total thickness TH1 of the heat dissipation tape HT overlapping the sub area SA of the display module DP being greater than the second total thickness TH2 of the heat dissipation tape HT overlapping the main film portion MB of the printed circuit film FPCB may be achieved by adjustment of a thickness of the lower adhesive layer of the heat dissipation tape HT overlapping the sub area SA and a thickness of the lower adhesive layer of the heat dissipation tape HT overlapping the main film portion MB of the printed circuit film FPCB. That is, the thickness of the lower adhesive layer of the heat dissipation tape HT overlapping the sub area SA of the display module DP may be greater than the thickness of the lower adhesive layer overlapping the main film portion MB of the printed circuit film FPCB.

When explaining the above described contents in terms of each heat dissipation tape portion of the heat dissipation tape HT, the first heat dissipation tape portion HTP1 may include a heat dissipation metal layer DHM, a first lower adhesive layer AD1 disposed on a lower surface of the heat dissipation metal layer DHM, and a first upper adhesive layer AD2 disposed on an upper surface of the heat dissipation metal layer DHM, the second heat dissipation tape portion HTP2 may include the heat dissipation metal layer DHM, a second lower adhesive layer AD3 disposed on the lower surface of the heat dissipation metal layer DHM, and a second upper adhesive layer AD4 disposed on the upper surface of the heat dissipation metal layer DHM, and the third heat dissipation tape portion HTP3 may include only the heat dissipation metal layer DHM.

The heat dissipation metal layer DHM is commonly disposed from the sub area SA of the display module DP to the printed circuit film FPCB, and thus the heat dissipation metal layer DHM may serve to dissipate more heat generated from the sub area SA of the display module DP or the printed circuit film FPCB to outside the display device 1. To this end, the heat dissipation metal layer DHM may further include aluminum, in addition to the exemplified material of the heat dissipation layer MP described above. In particular, the heat dissipation metal layer DHM is further disposed even at a space between the end portion of the sub area SA and the main film portion MB, so that the heat dissipation effect is improved at an attachment film portion CB of the printed circuit film FPCB and the display module DP compared to a case in which the printed circuit film FPCB and the display module DP are disposed separately.

In an embodiment, for example, a first thickness t1 of the heat dissipation metal layer DHM may be uniform from the sub area SA to the main film portion MB, and each of a third thickness t3 of the first upper adhesive layer AD2 of the first heat dissipation tape portion HTP1 and a fifth thickness t5 of the second upper adhesive layer AD4 of the second heat dissipation tape portion HTP2 may be in a range from about 0.02 millimeter (mm) to about 0.04 mm. The third thickness t3 of the first upper adhesive layer AD2 of the first heat dissipation tape portion HTP1 and the fifth thickness t5 of the second upper adhesive layer AD4 of the second heat dissipation tape portion HTP2 may be the same.

Further, a fourth thickness t4 of the second lower adhesive layer AD3 of the second heat dissipation tape portion HTP2 and the fifth thickness t5 of the second upper adhesive layer AD4 of the second heat dissipation tape portion HTP2 may be the same.

The first total thickness TH1 of the first heat dissipation tape portion HTP1 may be greater than the second total thickness TH2 of the second heat dissipation tape portion HTP2. Since an upper surface of the attachment film portion CB is disposed closer to the first backplane BP1 than an upper surface of the second backplane BP2, the first total thickness TH1 of the first heat dissipation tape portion HTP1 may be greater than the second total thickness TH2 of the second heat dissipation tape portion HTP2 to compensate for a step between the upper surface of the main film portion MB and the upper surface of the second backplane BP2 that are at different levels (e.g., in different planes from each other). The disposition of the upper surface of the main film portion MB closer to the first backplane BP1 than the upper surface of the second backplane BP2 is related to a thickness of the printed circuit film FPCB, a thickness of the display module DP, and a thickness of the second backplane BP2.

Since a first thickness portion H1 of the printed circuit film FPCB at the attachment film portion CB is smaller than a second thickness portion H2 of the printed circuit film FPCB at the main film portion MB, and since the sum of the thickness of the display module DP and the thickness of the second backplane BP2 is smaller than a difference between the second thickness portion H2 of the printed circuit film FPCB at the main film portion MB and the first thickness portion H1 of the printed circuit film FPCB at the attachment film portion CB, the upper surface of the main film portion MB may be disposed closer to the first backplane BP1 than the upper surface of the second backplane BP2.

When the step is generated between the upper surface of the main film portion MB and the upper surface of the second backplane BP2 at the different levels, a surface of the first backplane BP1 coupled to the upper surface of the main film portion MB and the upper surface of the second backplane BP2 is curved due to the corresponding step, and the curve may hinder the flattening of the display module DP.

In order to compensate for the step generated between the upper surface of the main film portion MB and the upper surface of the second backplane BP2 at the different levels relative to the first backplane BP1, the thickness of the heat dissipation tape HT at the first heat dissipation tape portion HTP1 may be formed larger than the thickness of the heat dissipation tape HT at the second heat dissipation tape portion HTP2. Thus, since the first total thickness TH1 of the heat dissipation tape HT at the first heat dissipation tape portion HTP1 is the same as a first separation distance between the upper surface of the second backplane BP2 and the first backplane BP1 (or the heat dissipation layer MP) and the second total thickness TH2 of the heat dissipation tape HT at the second heat dissipation tape portion HTP2 is the same as a second separation distance between the upper surface of the main film portion MB and the first backplane BP1 (or the heat dissipation layer MP), it is possible to compensate for the step generated between the upper surface of the main film portion MB and the upper surface of the second backplane BP2 at the different levels relative to the first backplane BP1.

Further, in terms of process convenience, since controlling the thicknesses of the first and second lower adhesive layers AD1 and AD3 positioned on the lower surface of the heat dissipation metal layer DHM is easier than controlling the thickness of the heat dissipation metal layer DHM of the heat dissipation tape HT at each of the heat dissipation tape portions HTP1 and HTP2, as shown in FIGS. 6 and 7, the corresponding step may be compensated by forming the second thickness t2 of the first lower adhesive layer AD1 larger than the fourth thickness t4 of the second lower adhesive layer AD3.

According to one or more embodiment of the display device 1, the heat dissipation tape HT is disposed in an entirety of an area from the sub area SA to the printed circuit film FPCB, so that spaces between the heat dissipation layer MP and the printed circuit film FPCB, and between the heat dissipation layer MP and the second backplane BP2 may be more easily sealed. Accordingly, separate sealing members (e.g., sealing resin, etc.) may be omitted between the heat dissipation layer MP and the printed circuit film FPCB, and between the heat dissipation layer MP and the second backplane BP2, thereby reducing material cost and improving process convenience.

In the following embodiments, the same components as those of the embodiments already described will be referred to with the same reference numerals, and the description thereof will be omitted or simplified.

Figure 8:
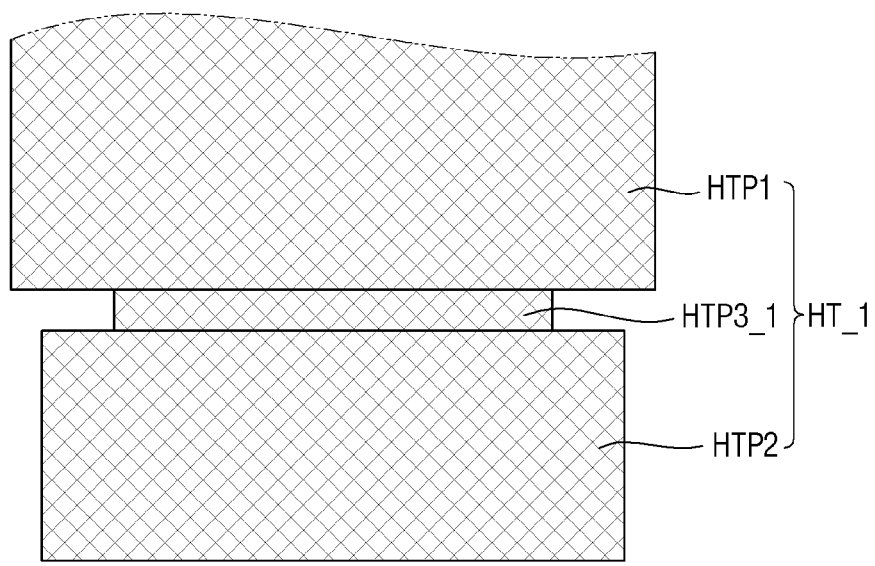
FIG. 8 is a plan view showing an embodiment of a heat dissipation tape.
Figure 8:
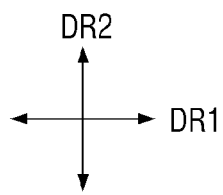
Figure 9:
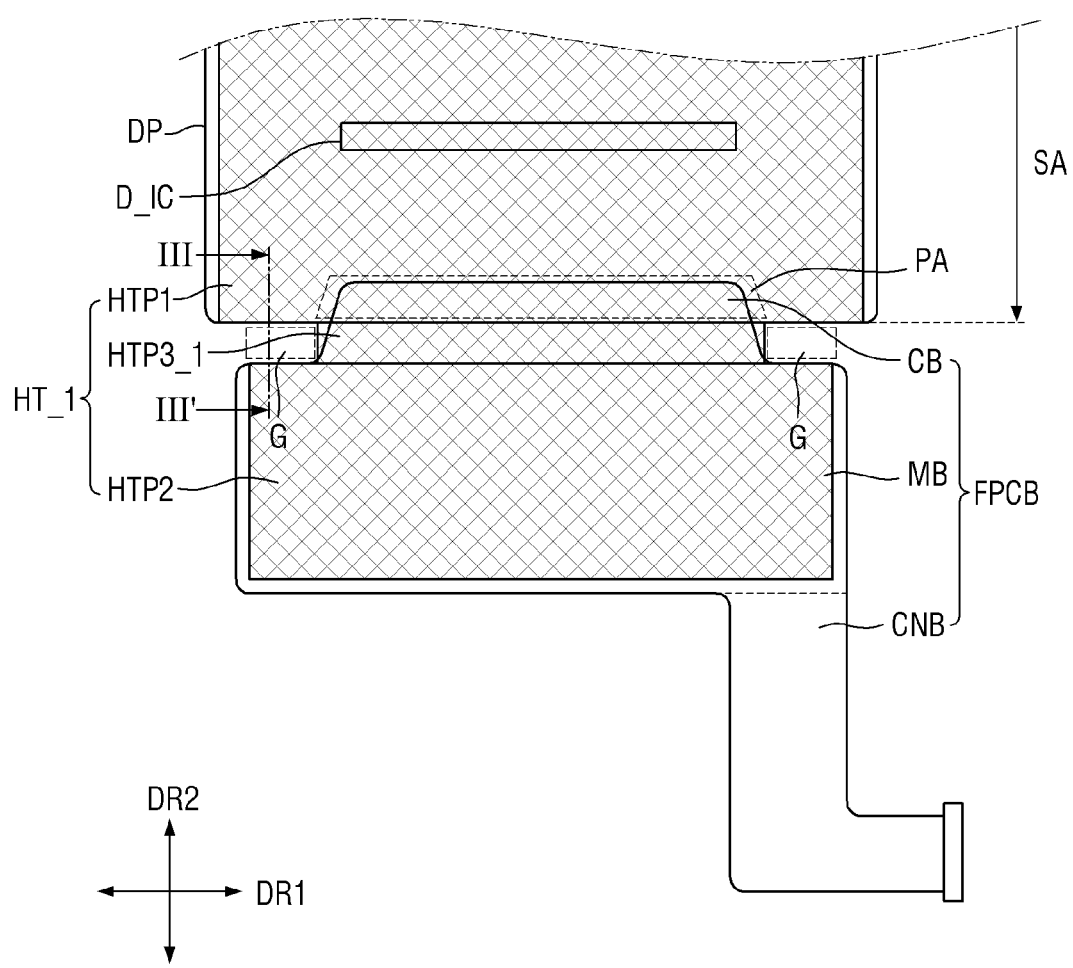
FIG. 9 is a plan view showing an embodiment of attachment of the heat dissipation tape in FIG. 8 to the sub area of the display module and the printed circuit film in FIG. 3.
Figure 10:
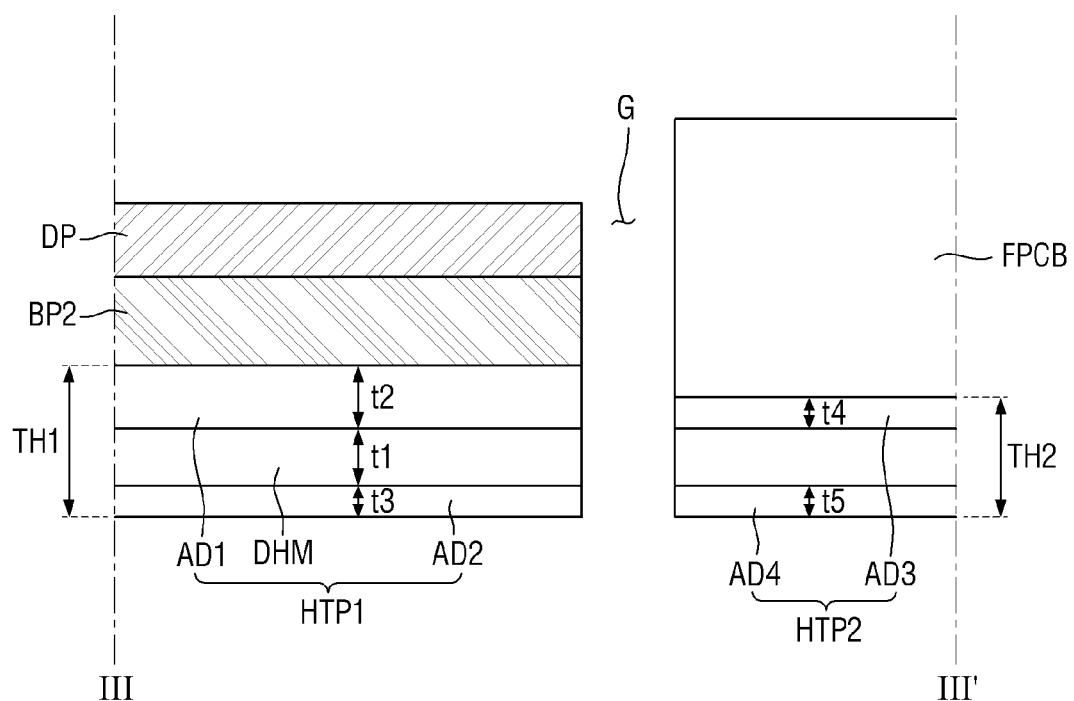
FIG. 10 is an enlarged cross-sectional view taken along line III-III' of FIG. 9.

FIG. 8 is a plan view showing an embodiment of a heat dissipation tape HT_1. FIG. 9 is a plan view showing an embodiment of an attachment of the heat dissipation tape HT_1 in FIG. 8 to the sub area SA of the display module DP and the printed circuit film FPCB in FIG. 3. FIG. 10 is an enlarged cross-sectional view taken along line III-III' of FIG. 9.

Referring to FIGS. 8 to 10, the display device 1 is different from the display device 1 in FIGS. 4 to 7 in that a third heat dissipation tape portion HTP3_1 of a heat dissipation tape HT_1 of the display device 1 does not overlap the gap G (e.g., is excluded from the gap G) between the outer portion not connected to the attachment film portion CB of the main film portion MB and the sub area SA of the display module DP on a plane.

More specifically, the third heat dissipation tape portion HTP3_1 of the heat dissipation tape HT_1 of the display device 1 may not overlap the gap G between the outer portion not connected to the attachment film portion CB of the main film portion MB and the sub area SA of the display module DP on a plane. That is, the third heat dissipation tape portion HTP3 does not extend further than the opposing sides of the attachment film portion CB along the first direction DR1 to correspond to the gap G. Instead, sides of the third heat dissipation tape portion HTP3 corresponds to the opposing sides of the attachment film portion CB along the first direction DR1 such that the third heat dissipation tape portion HTP3 is excluded from between the main film portion MB of the printed circuit film FPCB and the sub area SA of the display module DP.

As described above with reference to FIGS. 4 to 7, portions of the printed circuit film FPCB or the display module DP are not disposed in the gap G between the sub area SA of the display module DP and the outer portion not connected to the attachment film portion CB of the main film portion MB on a plane. Therefore, heat generated in the corresponding portion by the printed circuit film FPCB or the display module DP may be a relatively small amount of heat as compared with the attachment film portion CB attached to the sub area SA of the display module DP of the printed circuit film FPCB.

Therefore, according to one or more embodiment of the display device 1, there is an advantage that it is possible to reduce the material cost for forming the third heat dissipation tape portion HTP3_1 by excluding a portion of the third heat dissipation tape portion HTP3_1 from the gap G between the sub area SA of the display module DP and the outer portion not connected to the attachment film portion CB of the main film portion MB on a plane in which the printed circuit film FPCB or the display module DP is not disposed.

According to one or more embodiment of the display device 1, the heat dissipation tape HT_1 is disposed in an entirety of an area from the sub area SA to the printed circuit film FPCB, so that spaces between the heat dissipation layer MP and the printed circuit film FPCB, and between the heat dissipation layer MP and the second backplane BP2 may be more easily sealed. Accordingly, separate sealing members (e.g., sealing resin, etc.) may be omitted between the heat dissipation layer MP and the printed circuit film FPCB, and between the heat dissipation layer MP and the second backplane BP2, thereby reducing material cost and improving process convenience.

Figure 11:
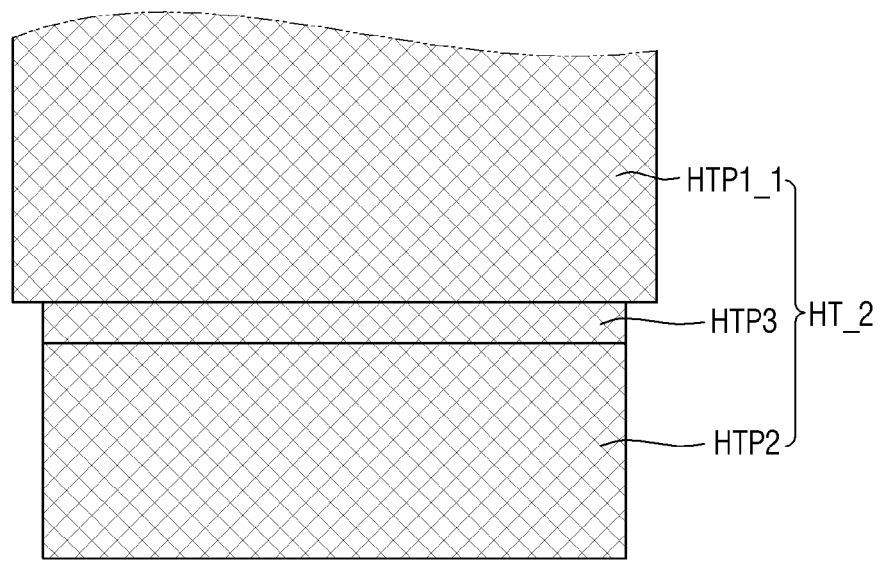
FIG. 11 is a plan view showing an embodiment of a heat dissipation tape.
Figure 11:
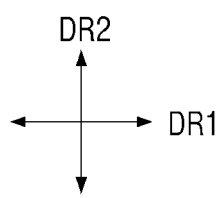
Figure 12:
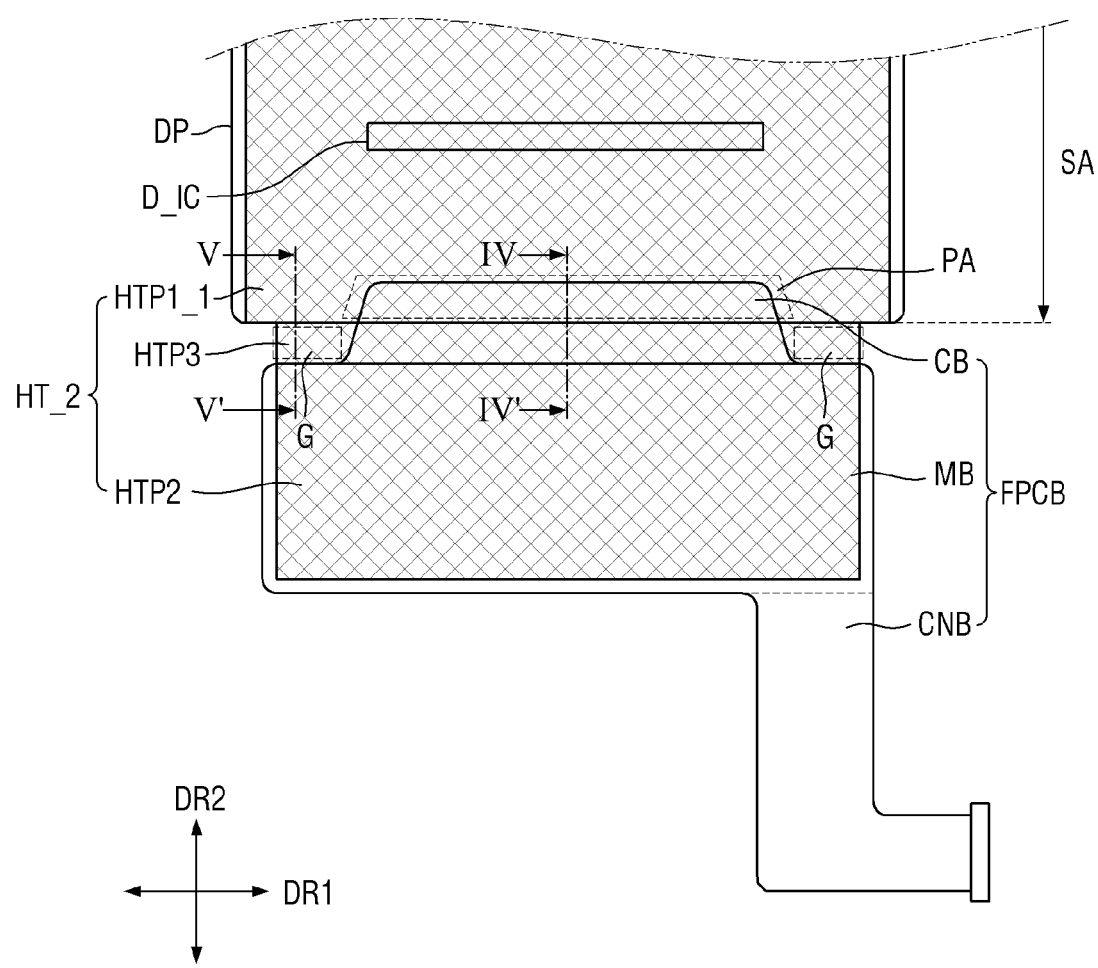
FIG. 12 is a plan view showing an embodiment of attachment of the heat dissipation tape in FIG. 11 to the sub area of the display module and the printed circuit film in FIG. 3.
Figure 13:
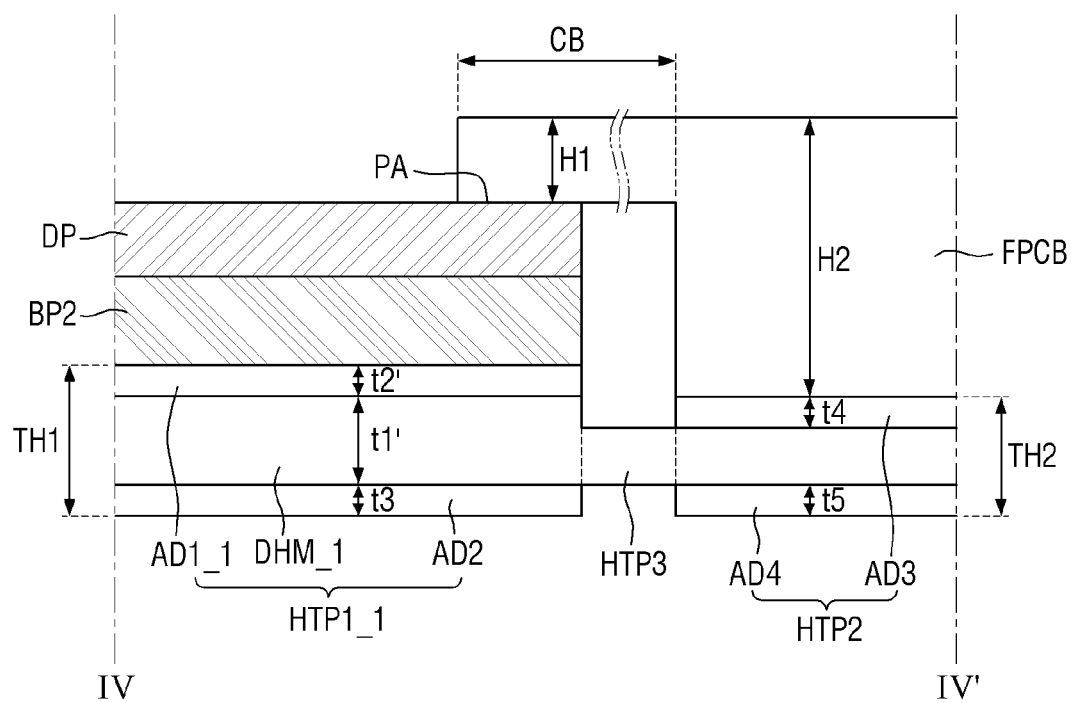
FIG. 13 is an enlarged cross-sectional view taken along line IV-IV' of FIG. 12.
Figure 14:
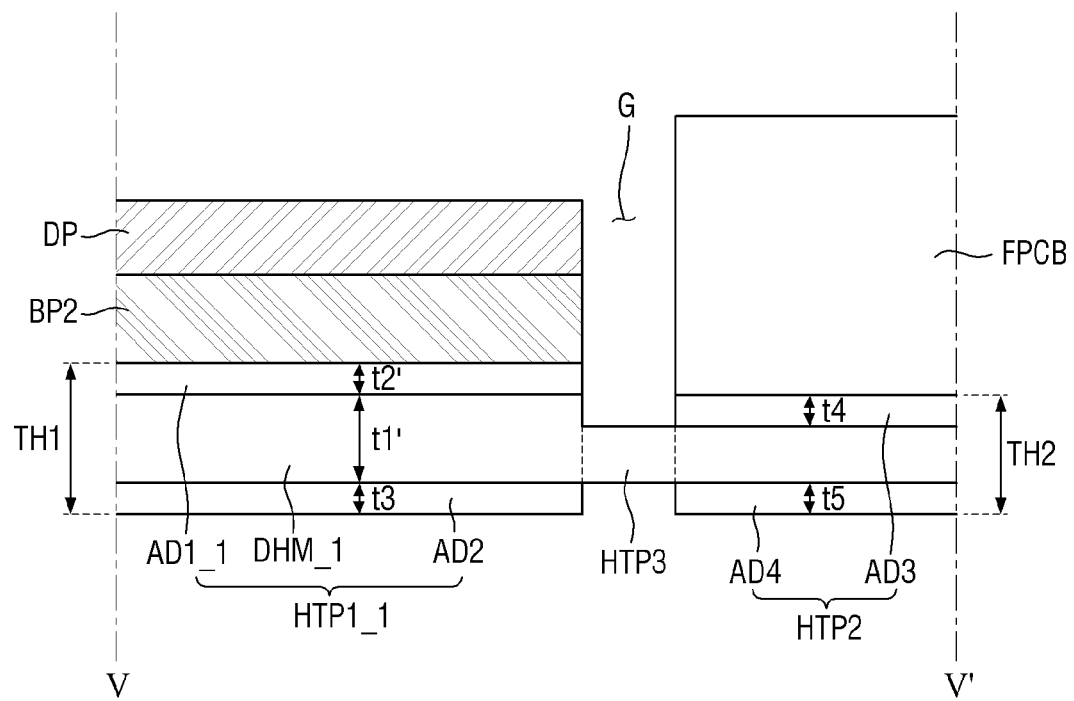
FIG. 14 is an enlarged cross-sectional view taken along line V-V' of FIG. 12.

FIG. 11 is a plan view showing an embodiment of a heat dissipation tape HT_2. FIG. 12 is a plan view showing an embodiment of attached of the heat dissipation tape HT_2 in FIG. 11 to the sub area SA of the display module DP and the printed circuit film FPCB in FIG. 3. FIG. 13 is an enlarged cross-sectional view taken along line IV-IV' of FIG. 12. FIG. 14 is an enlarged cross-sectional view taken along line V-V' of FIG. 12.

Referring to FIGS. 11 to 14, the display device 1 is different from the display device 1 in FIGS. 4 to 7 in that each of a first heat dissipation tape portion HTP1_1 and a second heat dissipation tape portion HTP2 of a heat dissipation tape HT_2 of the display device 1 has the same thickness as the first heat dissipation tape portion HTP1 and the second heat dissipation tape portion HTP2 described in FIGS. 6 and 7, but a first total thickness TH1 of the first heat dissipation tape portion HTP1_1 is formed by adjusting a first thickness t1' of a heat dissipation metal layer DHM_1 of the first heat dissipation tape portion HTP1_1.

More specifically, each of the first heat dissipation tape portion HTP1_1 and the second heat dissipation tape portion HTP2 of the heat dissipation tape HT_2 of the display device 1 has the same thickness as the first heat dissipation tape portion HTP1 and the second heat dissipation tape portion HTP2 described in FIGS. 6 and 7, but the first total thickness TH1 of the first heat dissipation tape portion HTP1_1 may be formed by adjusting the first thickness t1' of the heat dissipation metal layer DHM_1 of the first heat dissipation tape portion HTP1_1.

That is, the first thickness t1' of the heat dissipation metal layer DHM_1 of the first heat dissipation tape portion HTP1_1 may be greater than the first thickness t1 of the heat dissipation metal layer DHM of the second heat dissipation tape portion HTP2 and the first thickness t1 of the heat dissipation metal layer DHM of the third heat dissipation tape portion HTP3. In addition, the first total thickness TH1 of the first heat dissipation tape portion HTP1_1 is formed by adjusting the first thickness t1' of the heat dissipation metal layer DHM_1 of the first heat dissipation tape portion HTP1_1, and thus a second thickness t2' of a first lower adhesive layer AD1_1 becomes smaller than the second thickness t2 of the first lower adhesive layer AD1 formed to have a larger thickness than the second lower adhesive layer AD3 in FIGS. 6 and 7, and a degree of reduction may be the same as a difference between the first thickness t1' of the heat dissipation metal layer DHM_1 of the first heat dissipation tape portion HTP1_1 and the first thickness t1 of the heat dissipation metal layer DHM of the first heat dissipation tape portion HTP1.

The second thickness t2' of the first lower adhesive layer AD1_1 may be the same as the fourth thickness t4 of the second lower adhesive layer AD3.

According to one or more embodiment of the display device 1, the heat dissipation tape HT_2 is disposed in an entirety of an area from the sub area SA to the printed circuit film FPCB, so that spaces between the heat dissipation layer MP and the printed circuit film FPCB, and between the heat dissipation layer MP and the second backplane BP2 may be more easily sealed. Accordingly, separate sealing members (e.g., sealing resin, etc.) may be omitted between the heat dissipation layer MP and the printed circuit film FPCB, and between the heat dissipation layer MP and the second backplane BP2, thereby reducing material cost and improving process convenience.

According to one or more embodiment of a display device 1, a heat dissipation function of a display module DP and a printed circuit film FPCB can be further improved.

Effects according to the embodiments are not limited by the contents exemplified above, and more various effects are included in the present specification.

What is claimed is:
1. A display device comprising:
    a display module including a display area and a non-display area which is adjacent to the display area;
    a first heat dissipation layer corresponding to the non-display area of the display module; and
    a printed circuit film attached to the display module at the non-display area thereof and to the first heat dissipation layer,
    wherein the first heat dissipation layer extends from the non-display area of the display module to correspond to the printed circuit film.

2. The display device of claim 1, wherein
the non-display area of the display module includes:
- a sub area through which an electrical signal is provided to the display module from outside thereof, and
- a bending area at which the display module is bendable, the bending area between the display area and the sub area, and
the display module which is bent at the bending area disposes the sub area overlapping the display area along a thickness direction of the display module.

3. The display device of claim 2, wherein the display module which is bent at the bending area further disposes the first heat dissipation layer between the sub area and the display area which overlap along the thickness direction of the display module.

4. The display device of claim 3, wherein the display module which is bent at the bending area further disposes the first heat dissipation layer between the printed circuit film and the display module along the thickness direction of the display module.

5. The display device of claim 4, further comprising:
- a first backplane which corresponds to the display area of the display module; and
- a second backplane which corresponds to the sub area of the display module.

6. The display device of claim 5, further comprising a second heat dissipation layer which faces the display area of the display module with the first backplane therebetween,
wherein the display module which is bent at the bending area further disposes the second heat dissipation layer between the first backplane and the first heat dissipation layer.

7. The display device of claim 6, wherein the first heat dissipation layer couples the second heat dissipation layer and the printed circuit film to each other, and couples the second heat dissipation layer and the second backplane to each other.

8. The display device of claim 5, wherein
the printed circuit film is attached to the display module at the sub area thereof and extends from the sub area in a first direction, and
the printed circuit film includes:
- an attachment portion at which the printed circuit film is attached to the sub area of the display module,
- a main portion extended from the attachment portion in the first direction, and
- each of the attachment portion and the main portion having a width along a second direction which crosses the first direction,
wherein the width of the main portion is larger than the width of the attachment portion.

9. The display device of claim 8, wherein the first heat dissipation layer includes:
- a first heat dissipation portion which corresponds to the sub area of the display module,
- a second heat dissipation portion which corresponds to the main portion of the printed circuit film, and
- a third heat dissipation portion which connects the first heat dissipation portion and the second heat dissipation portion to each other.

10. The display device of claim 9, wherein the third heat dissipation portion extends along the second direction.

11. The display device of claim 10, wherein within the printed circuit film:
- each of the attachment portion and the main portion has a thickness along the thickness direction, and
- the thickness of the attachment portion is smaller than the thickness of the main portion.

12. The display device of claim 11, wherein the display module which is bent at the bending area further disposes the main portion of the printed circuit film closer to the first backplane than the second backplane along the thickness direction of the display module.

13. The display device of claim 12, wherein within the first heat dissipation layer:
- each of the first heat dissipation portion which corresponds to the sub area of the display module and the second heat dissipation portion which corresponds to the main portion of the printed circuit film has a thickness, and
- the thickness of the first heat dissipation portion is greater than the thickness of the second heat dissipation portion.

14. The display device of claim 13, wherein
the main portion of the printed circuit film and the first backplane are spaced apart by a first separation distance,
the second backplane and the first backplane are separated by a second separation distance,
the thickness of the second heat dissipation portion is the same as the first separation distance between the main portion of the printed circuit film and the first backplane, and
the thickness of the first heat dissipation portion is the same as the second separation distance between the second backplane and the first backplane.

15. The display device of claim 9, wherein
the attachment portion of the printed circuit film has opposing sides along the second direction,
the main portion of the printed circuit film extends further along the second direction than each of the opposing sides of the attachment portion to define an outer portion of the main portion, and
the outer portion of the main portion of the printed circuit film is disconnected along the first direction from the display module to define a gap between the outer portion of the main portion and the display module.

16. The display device of claim 15, wherein the third heat dissipation portion of the first heat dissipation layer has opposing sides along the second direction which correspond to the opposing sides of the attachment portion of the printed circuit film.

17. A display device comprising:
- a display module including a display area, a bending area at which the display module is bendable, and a sub area through which an electrical signal is provided to the display module from outside thereof, in order along a first direction;
- a printed circuit film attached to the display module at the sub area thereof, the printed circuit film including:
  - an attachment portion at which the printed circuit film is attached to the sub area of the display module,
  - a main portion extended in the first direction from the attachment portion, and
  - each of the attachment portion and the main portion having a width along a second direction which crosses the first direction,
  wherein the width of the main portion is larger than the width of the attachment portion; and
- a heat dissipation layer corresponding to the sub area of the display module, wherein
the heat dissipation layer extends in the first direction from the sub area of the display module to correspond to the printed circuit film, and
the display module which is bent at the bending area disposes:
  the sub area overlapping the display area along a thickness direction of the display module,
  the heat dissipation layer between the display area of the display module and the sub area of the display module along the thickness direction of the display module,
  the heat dissipation layer corresponding to the printed circuit film along the thickness direction of the display module, and
  the heat dissipation layer having a variable thickness along the thickness direction of the display module, in the first direction.

18. The display device of claim 17, wherein the heat dissipation layer includes:
  a heat dissipation metal layer corresponding to each of the sub area of the display module and the printed circuit film, and
  an adhesive layer between the heat dissipation metal layer and the sub area of the display module and between the heat dissipation metal layer and the printed circuit film.

19. The display device of claim 18, wherein
each of the heat dissipation layer and the adhesive layer thereof has a thickness along the thickness direction of the display module,
the thickness of the heat dissipation layer which corresponds to the sub area of the display module is greater than the thickness of the heat dissipation layer which corresponds to the main portion of the printed circuit film, and
within the heat dissipation layer, the thickness of the adhesive layer which corresponds to the sub area of the display module is greater than the thickness of the adhesive layer which corresponds to the main portion of the printed circuit film.

20. The display device of claim 19, wherein
the attachment portion of the printed circuit film has opposing sides along the second direction,
the main portion of the printed circuit film extends further along the second direction than each of the opposing sides of the attachment portion to define an outer portion of the main portion,
the adhesive layer has opposing sides along the second direction which correspond to the opposing sides of the attachment portion of the printed circuit film, and
at the opposing sides of the attachment portion of the printed circuit film and the opposing sides of the adhesive layer, the printed circuit film and the adhesive layer are disconnected along the first direction from the display module to define a gap between the display module and the attachment portion of the printed circuit film and between the display module and the adhesive layer.

* * * * *